United States Patent [19]
Chitayat

[11] Patent Number: 4,782,236
[45] Date of Patent: Nov. 1, 1988

[54] MEANS FOR LOCKING A WORKPIECE TO A BEAM-GENERATING APPARATUS

[76] Inventor: Anwar Chitayat, P.O. Box 107, Northport, N.Y. 11768

[21] Appl. No.: 15,375

[22] Filed: Feb. 17, 1987

[51] Int. Cl.$^4$ .................. G01F 21/00; G21K 5/10
[52] U.S. Cl. .................. 250/440.1; 250/442.1; 250/491.1
[58] Field of Search ............ 250/440.1, 442.1, 491.1; 378/79; 310/328; 269/316, 319, 320

[56] References Cited
U.S. PATENT DOCUMENTS

| | | | |
|---|---|---|---|
| 3,426,193 | 2/1969 | Guernet | 250/442.1 |
| 3,678,270 | 7/1972 | Braun et al. | 250/442.1 |
| 4,525,852 | 6/1985 | Rosenberg | 310/328 |
| 4,689,516 | 8/1987 | Yokoyama et al. | 310/328 |
| 4,705,951 | 11/1987 | Layman et al. | 250/442.1 |

Primary Examiner—Bruce C. Anderson
Attorney, Agent, or Firm—Thomas R. Morrison

[57] ABSTRACT

A positioning table includes a light-weight workpiece supported thereabove on programmed dynamic support assemblies below a beam-generating apparatus. The positioning table performs gross positioning of the workpiece to bring a desired portion thereof under the influence of the beam-generating apparatus. The programmed dynamic support assemblies are actuated in a three-step sequence first for urging stabilizing posts on the workpiece into stabilizing contact with a base structure of the beam-generating apparatus, second for urging spring rods into contact with the bottom surface of the workpiece, and then for leaving the workpiece supported by the spring rods with the stabilizing posts in firm mechanical contact with the base structure of the beam-generating apparatus. Transverse vibrations in the beam-generating apparatus are directly transmitted to the workpiece through the stabilizing posts, whereby relative motion between the workpiece and the beam-generating apparatus is prevented. Transverse vibration in the positioning table are accommodated by the transverse resilience of the spring rods without transmitting such vibrations to the workpiece.

10 Claims, 7 Drawing Sheets

MEANS FOR LOCKING A WORKPIECE TO A BEAM-GENERATING APPARATUS

BACKGROUND OF THE INVENTION

The present invention relates to vibration isolation and, more particularly, to vibration isolation in applications requiring stable, high-precision, location of a workpiece with respect to an apparatus.

One type of apparatus capable of benefitting from the present invention includes a positioning table employed to position a workpiece with respect to an apparatus performing a desired function on the workpiece. Positioning tables are in routine use in applications wherein a workpiece is positioned along a linear axis for performing work thereon. Such a positioning table may be part of a system employing two or three stacked tables controllable along mutually orthogonal axes.

Some positioning tables are employed in applications requiring such precise and stable positioning that the required precision may be destroyed by vibration transmitted to the positioning table through the support structure of the apparatus. Such degradation in precision is especially severe when the frequencies of vibrations applied to the structure are capable of exciting resonant frequencies of the structure.

The prior art employs deep foundation structures isolated as much as possible from the surrounding earth to impart as much stability as possible to the base of a positioning table. Other techniques employ massive granite bases for damping higher vibration frequencies to prevent their transmission to a workpiece mounted on the positioning table.

In addition, relative motion between a workpiece and an apparatus performing a function on it may occur due to differences in resonant frequency, or amplitudes of vibrational motion of the two elements.

When relative positioning stability on the order of nanometers is required between a workpiece and, for example, a charged-particle-beam device of a type used for processing semiconductor masks or wafers, prior-art techniques fail to provide adequate solutions.

OBJECTS AND SUMMARY OF THE INVENTION

Accordingly, it is an object of the invention to provide a processing system which overcomes the drawbacks of the prior art.

It is a further object of the invention to provide a system for providing mechanical coupling between a workpiece and a processing apparatus performing a processing operation on the workpiece, whereby relative positioning accuracy between the workpiece and the processing apparatus is held to a value smaller than the motion of the workpiece or the processing apparatus.

It is a further object of the invention to provide means for mechanically coupling a workpiece to a beam-generating apparatus to a workpiece.

It is a still further object of the invention to provide means for mechanically coupling a workpiece to a beam-generating apparatus and for mechanically decoupling the workpiece from its supporting apparatus.

It is a further object of the invention to provide a three-step coupling technique for coupling mechanically a workpiece of a positioning table to a base structure of a beam-generating device. After positioning the workpiece in a desired location, a first step employs a plurality of piezoelectric devices to raise the workpiece until stabilizing bars affixed to the top of the workpiece, generally aligned with the piezoelectric devices, provide stabilizing mechanical contact with the base structure of the beam-generating device. Then, a plurality of transversely resilient bars, one adjacent each piezoelectric device, are raised into contact with a bottom surface of the workpiece to urge the workpiece upward for maintaining the stabilizing bars in mechanical contact with the base structure of the beam-generating device. Finally, the piezoelectric devices are lowered, whereby the workpiece remains supported on the transversely resilient bars. Due to their transverse resilience, the transversely resilient bars permit the positioning table to move transverse to the axes of the transversely resilient bars without transmitting such motion to the workpiece which remains mechanically locked to the base structure of the beam-generating device.

Briefly stated, the present invention provides a lightweight workpiece supported on programmed dynamic support assemblies below a beam-generating apparatus. A positioning table performs gross positioning of the workpiece to bring a desired portion thereof under the influence of the beam-generating apparatus. The programmed dynamic support assemblies are actuated in a three-step sequence first for urging stabilizing posts on the workpiece into stabilizing contact with a base structure of the beam-generating apparatus, second for urging spring rods into contact with the bottom surface of the workpiece, and then for leaving the workpiece supported by the spring rods with the stabilizing posts in firm mechanical contact with the base structure of the beam-generating apparatus. Transverse vibrations in the beam-generating apparatus are directly transmitted to the workpiece through the stabilizing posts, whereby relative motion between the workpiece and the beam-generating apparatus is prevented. Transverse vibrations in the positioning table are accommodated by the transverse resilience of the spring rods without transmitting such vibrations to the workpiece.

According to an embodiment of the invention, there is provided apparatus for processing an item on a workpiece comprising: a beam-forming device, a workpiece, at least one dynamic support assembly effective for supporting the workpiece relative to a surface of the beam-forming device, at least one post on the workpiece extending toward the surface, the at least one post being generally aligned with the at least one dynamic support assembly, controllable means in the dynamic support assembly for urging the workpiece toward the surface for contacting the surface with the at least one post, and the controllable means including a transversely resilient member for maintaining contact between the post and the surface, whereby motion of the beam-forming device is transmitted to the workpiece and motion of an end of the post distal from the workpiece is permitted without imparting the motion of the distal end to the workpiece.

According to a feature of the invention, there is provided a method for stabilizing a workpiece with respect to a beam-forming device, comprising: supporting the workpiece and a with respect to a surface of the beam-forming device, positioning at least one post on a surface of the workpiece facing beam-forming device, urging a stable supporting device toward the workpiece, whereby the at least one post is urged toward the surface for contacting the surface with the at least one post, urging a transversely resilient member affixed to the positioning table into contact with the workpiece for maintaining contact between the post and the surface, and lowering the stable supporting device out of contact with the workpiece, whereby the workpiece is retained in an elevated position with the at least one post in stabilizing contact with the generally planar surface by the at least one transversely resilient member, whereby motion of the beam-forming device is transmitted to the workpiece and motion an end of the at least one post distal from said workpiece is permitted without imparting the motion the distal end to the workpiece.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
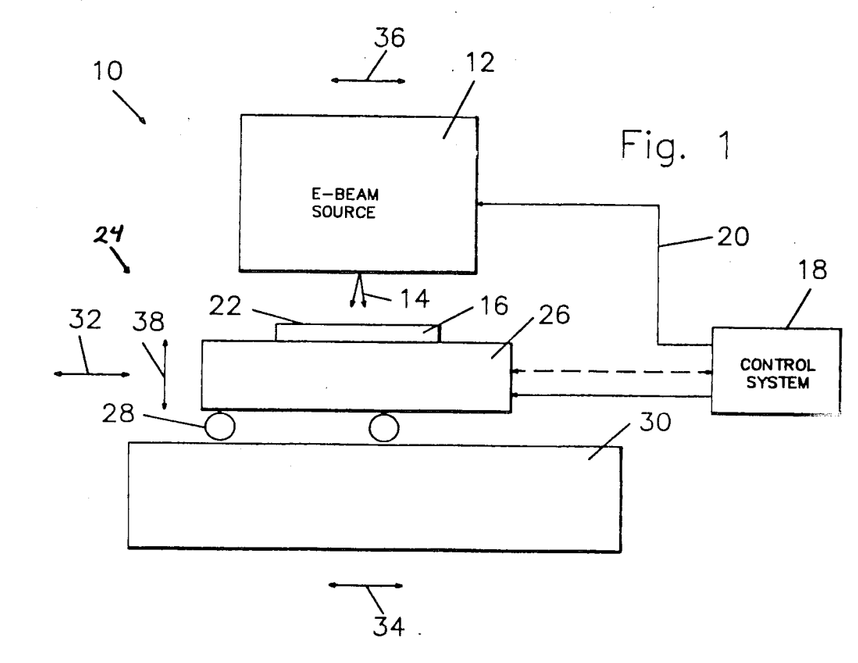
FIG. 1 is a simplified schematic diagram of an beam processing system to which the present invention may be applied.

Referring to FIG. 1, a beam-generating system is shown, generally at 10. A conventional beam source 12 produces a beam 14 capable of being steered with high accuracy upon a workpiece 16 containing an element (not specifically shown) to be treated by impingement of beam 14. Beam 14 may be of any convenient type such as, for example, electron beam, ion beam or X-ray beam. A control system 18 produces beam-control signals for connection on a line 20 to beam source 12.

The field of view on an upper surface 22 of workpiece 16, over which beam source 12 is capable of steering beam 14, is generally small compared to the area normally of upper surface 22, over which processing operations are desired. Accordingly, it is conventional to employ a positioning table 24 for moving desired portions of upper surface 22 in sequence under the influence of beam 14. Positioning table 24 includes a slide 26 supported by rollers 28 on a base 30. Slide 26 is displaced along an axis indicated by a horizontal double-headed arrow 32 under electrical and/or mechanical inputs from control system 18. The position of slide 26 along its axis is sensed by control system 18 using conventional techniques such as, for example, an optical interferometer (not shown). It will be understood that the illustration of positioning table 24 is highly schematic, containing only the level of description required to support a full disclosure of the present invention. At the level of detail presented above, all elements are conventional. One omitted item for some types of beam-generating systems, well understood by those skilled in the art, includes an evacuated chamber surrounding all of the elements illustrated in FIG. 1 with its associated evacuation equipment, control equipment, and access hatches. In an electron-beam system, for example, if the energy levels employed for accelerating electrons in beam 14 are high enough to produce substantial levels of X radiation, X-ray shielding (not shown) may also be required.

The apparatus in FIG. 1 illustrates motion of slide 26 along a single axis indicated by horizontal double-headed arrow 32. It is conventional to provide corresponding apparatus for moving workpiece 16 at right angles to horizontal double-headed arrow 32, along an axis perpendicular to the page, whereby any point on upper surface 22 may be brought under beam 14. Such corresponding apparatus may operate by moving base 30 along the orthogonal axis. However, such corresponding apparatus is the same as the apparatus illustrated in FIG. 1 and further description thereof is omitted.

Vibrations may be transmitted through base 30 and rollers 28 to slide 26 and thence to workpiece 16. The vibrations causing the predominant problems are in the direction perpendicular to beam 14, as indicated by a horizontal double-headed arrow 34. Similarly, vibrations may be transmitted to beam source 12 along the axis of motion of positioning table 24, as indicated by a horizontal double-headed arrow 36.

Due to differences in masses and resonant frequencies, the vibration-induced motions of workpiece 16 and beam source 12 are typically different in frequency, amplitude and phase. Thus, relative motion between beam source 12 and upper surface 22 are found exceeding the tolerances acceptable in high-precision work.

Motion in the vertical direction by one or both of beam source 12 and slide 26, as indicated by a vertical double-headed arrow 38, is of less concern since relative motion in this direction does not interfere in the same manner with accurate positioning of beam 14 on upper surface 22.

Figure 2:
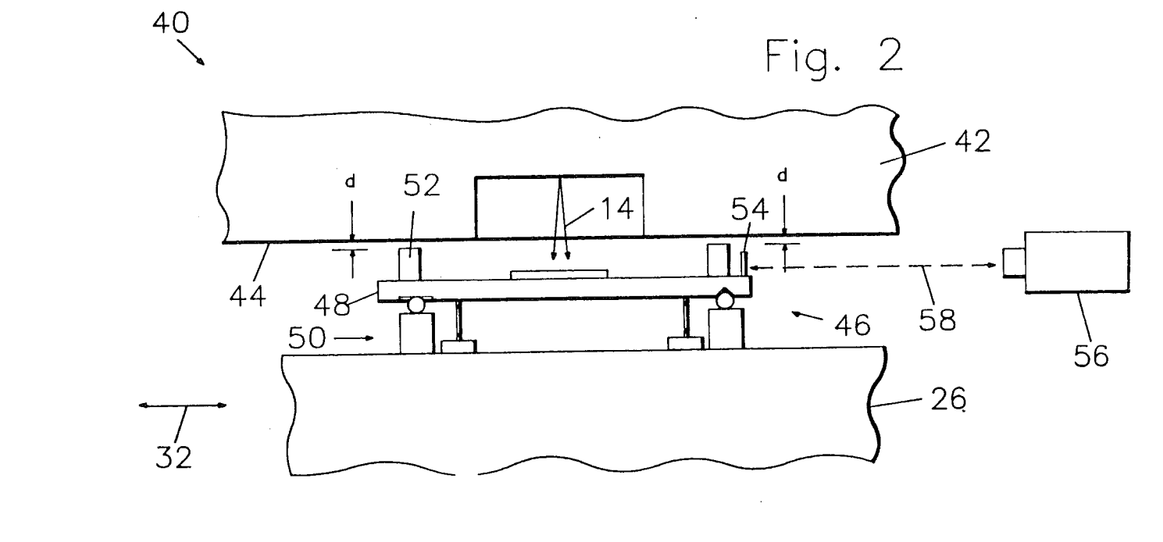
FIG. 2 is a closer view of a portion of the system of FIG. 1 showing elements of a support system according to an embodiment of the invention.

Referring now to FIG. 2, a beam-generating system 40, according to an embodiment of the invention, includes an beam source 42 having a planar lower surface 44. A workpiece assembly 46 includes a lightweight workpiece 48 supported above slide 26 on a plurality of programmed dynamic support assemblies 50. A plurality of posts 52 are disposed above workpiece 48. Each post 52 is generally aligned with a corresponding programmed dynamic support assembly 50.

A mirror 54 for an interferometer position-measuring device 56 is disposed on workpiece 48. An optical path 58 between interferometer position-measuring device 56 and mirror 54 is indicated by a dashed line.

It would be understood by one skilled in the art that interferometer position-measuring device 56 is effective for determining the position of workpiece 48 along a single axis. If beam-generating system 40 is a two-axis system, then an additional interferometer position-measuring device 56 (not shown) would be required for measuring the position of workpiece 48 along the second axis.

In the condition shown in FIG. 2, posts 52 are spaced a distance d from planar lower surface 44. With such spacing, slide 26 is enabled to move workpiece 48 along the axis of motion indicated by horizontal double-headed arrow 32 supported on programmed dynamic support assemblies 50. In the preferred embodiment of the invention, distance d is about 50 micrometers. This dimension is exaggerated in FIG. 2 and subsequent figures for purposes of illustration.

Figure 3:
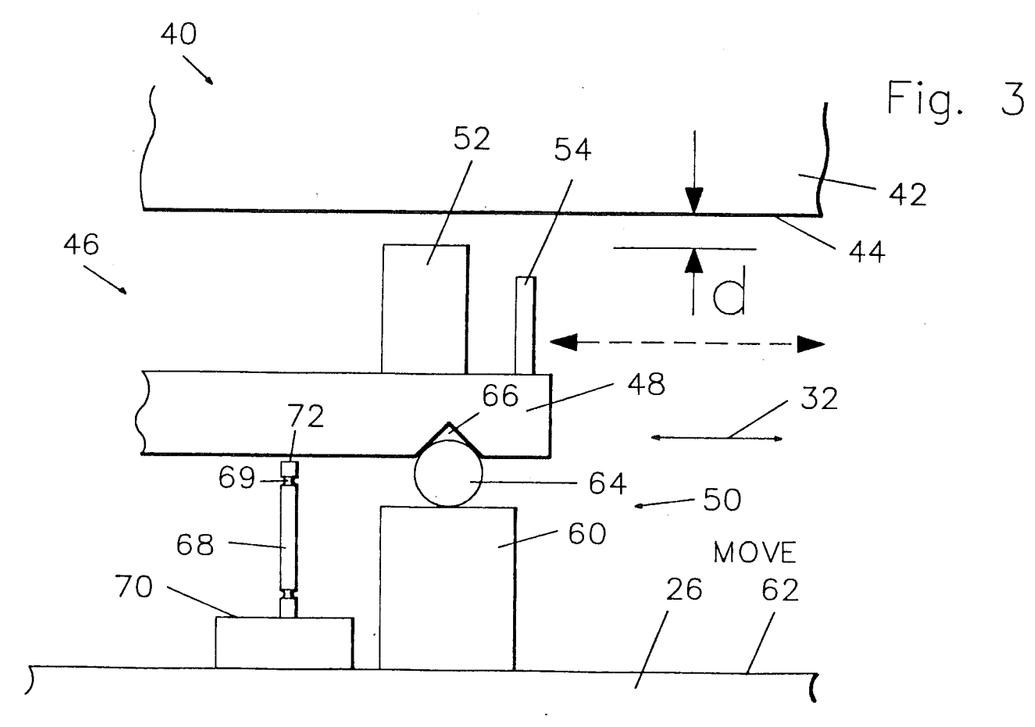
FIG. 3 is an even closer view of portions of one supporting station of the support system of FIG. 2 shown in its transport mode.

Referring now to FIG. 3, a close-up view of the vicinity of one programmed dynamic support assembly 50 shows a stable piezoelectric post 60 mounted on an upper surface 62 of slide 26 and having a support ball 64 disposed on its upper end. A shaped concavity 66 fits stably over support ball 64 for supporting workpiece 48 during transport thereof by slide 26.

A spring rod 68 rests with its lower end affixed to a piezoelectric base 70. An upper end 72 of spring rod 68 is disposed just out of contact with workpiece 48. One or more grooves 69 may be placed in spring rod 68 to adjust the transverse resilience thereof. In addition, differences in the materials, lengths and diameters of spring rod 68 may be selected for controlling the transverse resilience thereof. Thus, spring rod 68 is extremely stiff along its longitudinal axis and may be made as resilient as desired transverse to its longitudinal axis.

Figure 4:
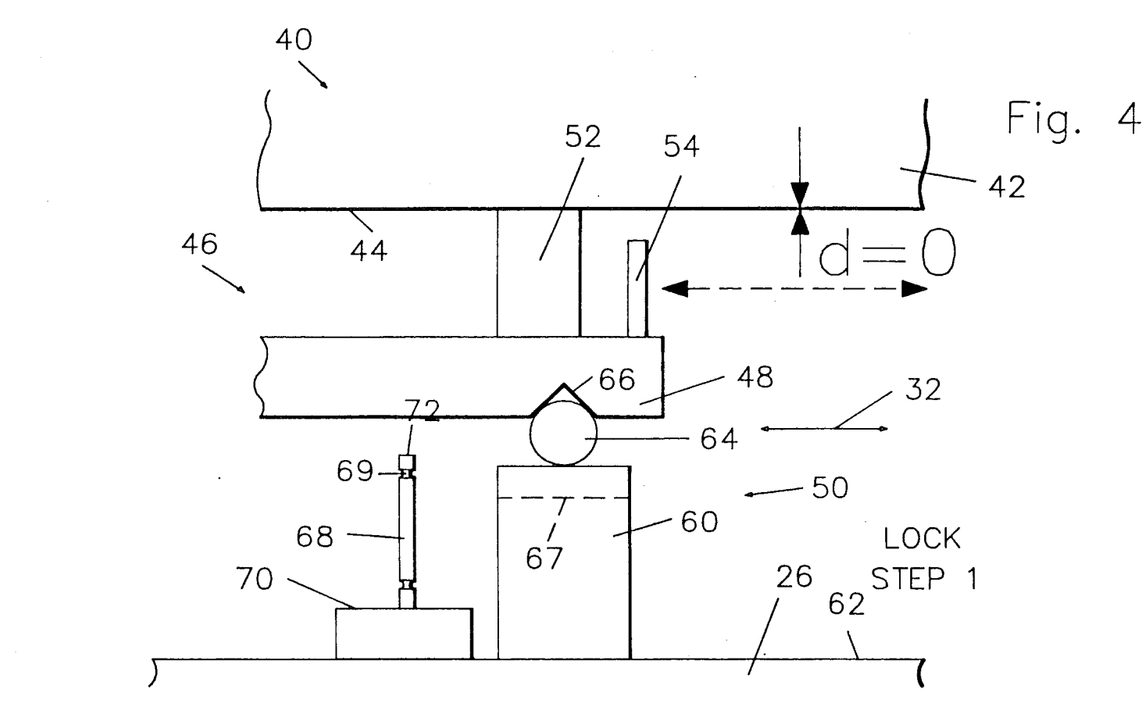
FIG. 4 is a view corresponding to FIG. 3 shown in its first locking step.

Referring now to FIG. 4, once slide 26 is moved into the desired position, the first step in the locking procedure includes energizing stable piezoelectric post 60, whereby it increases in length from its de-energized length shown in dashed line 67 to an extended length sufficient to urge post 52 into stabilizing mechanical contact with planar lower surface 44. In this condition, all relative motion between beam source 42 and workpiece 48 is resisted.

Figure 5:
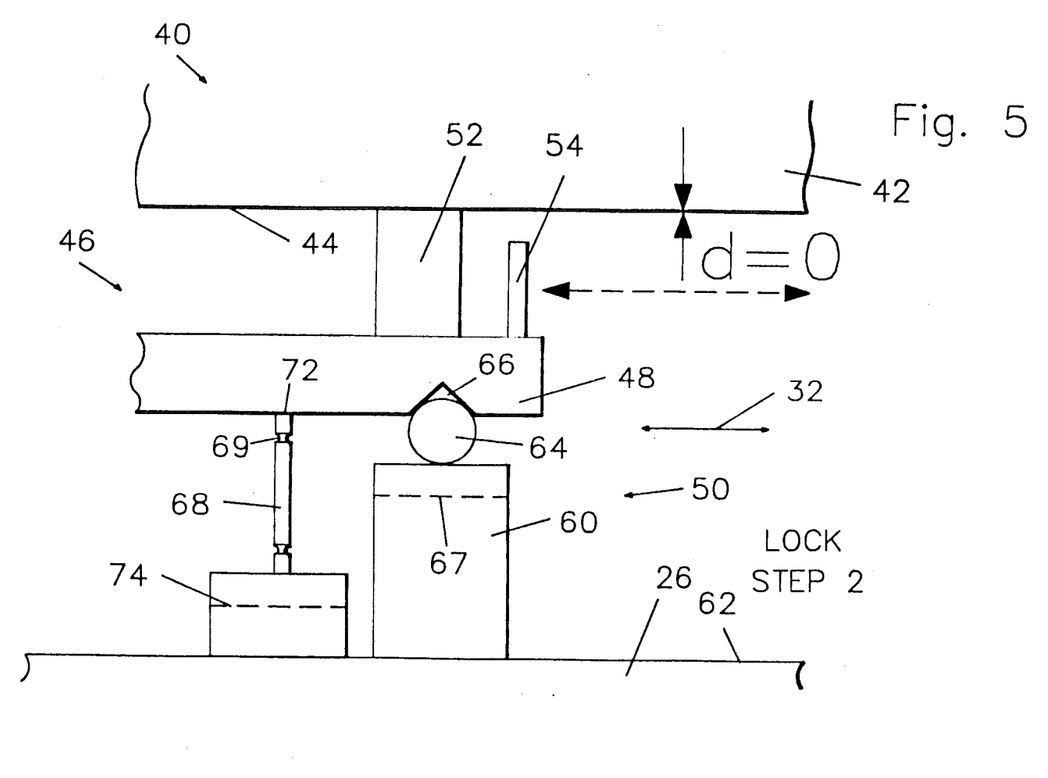
FIG. 5 is a view corresponding to FIG. 4 shown in its second locking step.

Referring now to FIG. 5, workpiece assembly 46 is shown in the second step in the locking procedure. Piezoelectric base 70 is energized to increase its length from the de-energized length, indicated by dashed line 74, to its energized length effective to raise upper end 72 of spring rod 68 into firm mechanical contact with workpiece 48.

Figure 6:
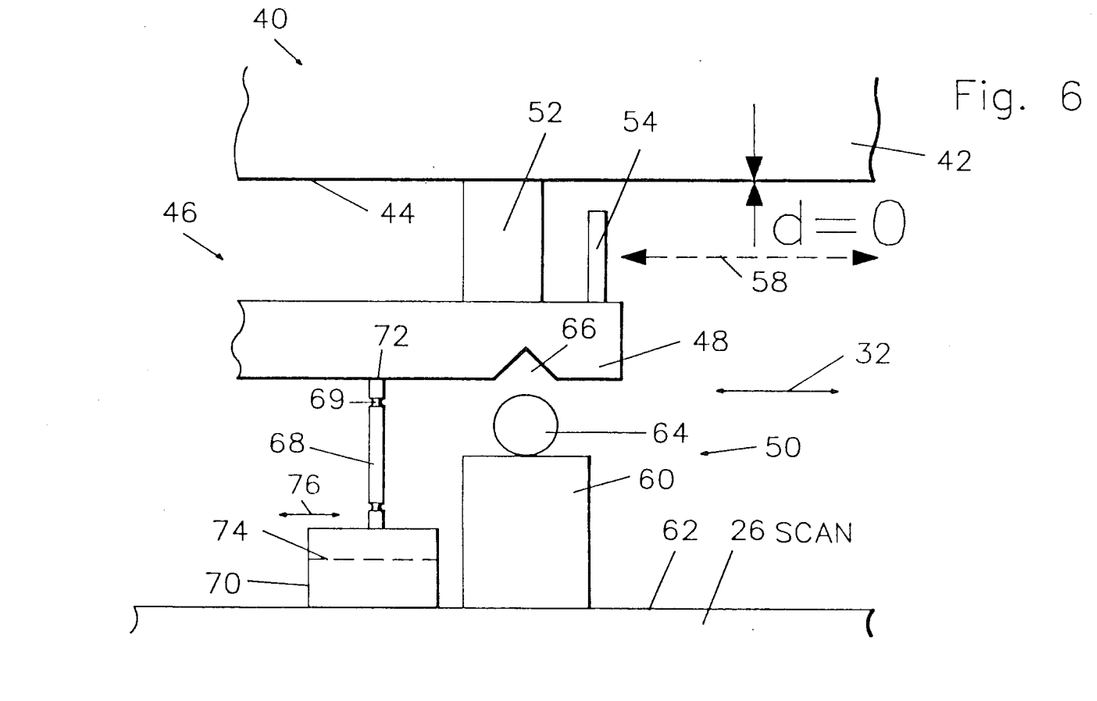
FIG. 6 is a view corresponding to FIG. 5 shown in its scan mode.

Referring now to FIG. 6, the final step in the locking procedure consists of de-energizing stable piezoelectric post 60 while maintaining piezoelectric base 70 energized. Thus, support ball 64 is lowered out of contact with shaped concavity 66 and workpiece 48 is supported on spring rod 68, as well as corresponding spring rods 68 in the remainder of programmed dynamic support assemblies 50 (FIG. 2). Support ball 64 is retained rigidly in its position atop piezoelectric post 60 by any convenient means (not shown). Mechanical contact between post 52 and planar lower surface 44 locks workpiece 48 to beam source 42, whereby any transverse vibration in beam source 42 is directly transmitted to workpiece 48. The resiliences of spring rods 68 are such that slide 26 is permitted to perform substantial transverse vibrational motion, as indicated by a double-headed arrow 76, without such transverse vibrational motion being transmitted to workpiece 48. Thus, workpiece 48 and beam source 42 remain mechanically locked while beam 14 (FIG. 2) is scanned over the portion of workpiece 48 presented to it without distortion from relative motion between the two.

Prior to moving slide 26, piezoelectric base 70 is de-energized to lower shaped concavity 66 onto support ball 64, thereby restoring workpiece assembly 46 to the condition shown in FIG. 3.

Figure 7:
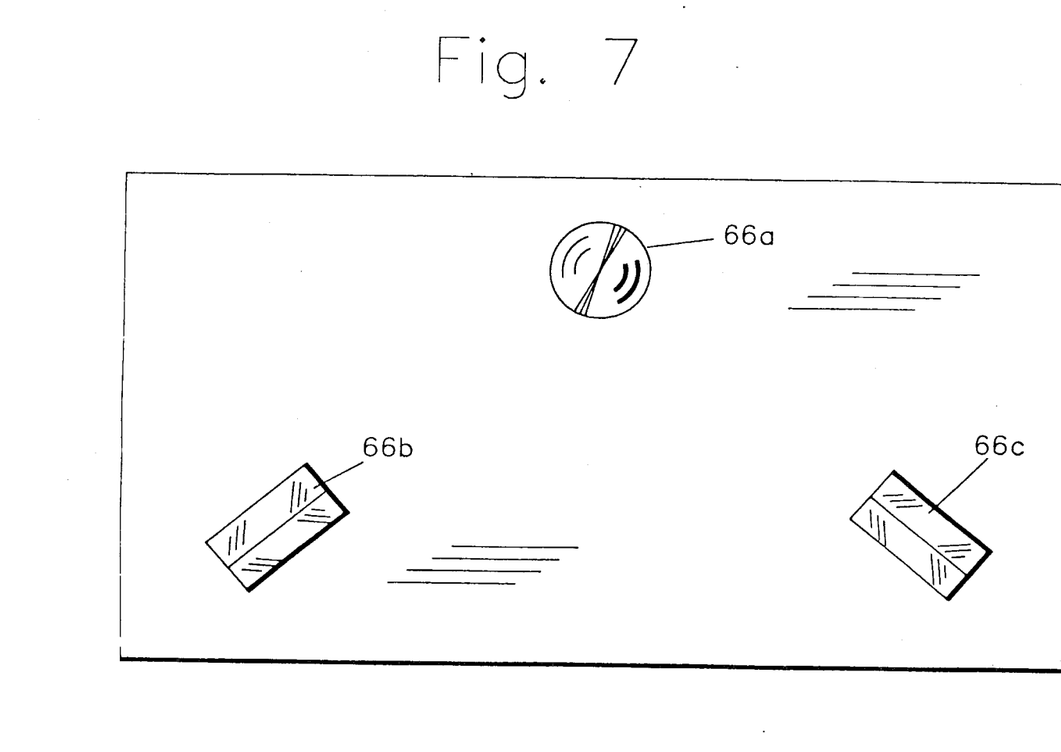
FIG. 7 is a bottom view of the workpiece of FIGS. 2-6.

Referring now to FIG. 7, an underside view of workpiece 48 indicates that three shaped concavities 66 may be employed. In order to provide for thermal expansion of workpiece 48, one of shaped concavities 66a may be a conical depression, and the remaining two shaped concavities 66b and 66c may be V-shaped grooves. Axes of the V-shaped grooves of shaped concavities 66b and 66c are preferably at right angles to each other to accommodated thermal expansion along all axes.

Although the present invention is disclosed in the environment of an apparatus employing charged particles for treating a workpiece, the invention should not be considered to be limited to such an environment. For example, uncharged particles or photons may be employed for treating a workpiece stabilized to the device generating the particles or photons. Photons may be at any convenient energy level and generated by any suitable apparatus. For example, a laser (not shown) including optical beam-steering means may be substituted for beam source 12 without departing from the spirit and scope of the invention. Similarly, an X-ray generator may replace beam source 12 and remain within the contemplation of the invention. The present invention should be construed as including such environments.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What I claim is:

1. Apparatus for supporting a workpiece with respect to a processing apparatus, comprising:
   a workpiece;
   at least one dynamic support assembly effective for supporting said workpiece relative to a surface of said processing apparatus:
   at least one psst on said workpiece extending toward said surface
   said at least one post disposed on a surface of said workpiece opposite to a surface of said workpiece facing said at least one dynamic support assembly;
   said at least one post being generally aligned with said at least one dynamic support assembly;
   controllable means in said dynamic support assembly for urging said workpiece toward said surface for contacting said surface with said at least one post;
   said controllable means including at least one transversely resilient member;
   said controllable means further including means for removing all support from said workpiece except said at least one transversely resilient member and said at least one post;
   said at least one post having rigidity effective for discouraging transverse resilience thereof;
   said at least one transversely resilient member including means for permitting transverse motion thereof at an end thereof abutting said workpiece in response to transverse motion of said workpiece, whereby motion of said processing apparatus is transmitted through said at least one post to said workpiece for providing locked motion between said workpiece and said surface, and motion of said workpiece with respect to said controllable means is permitted by said at least one transversey resilient member.

2. Apparatus for supporting a workpiece with respect to a processing apparatus, comprising:
   a workpiece;
   at least one dynamic support assembly effective for supporting said workpiece relative to a surface of said processing apparatus;

at least one post on said workpiece extending toward said surface;

said at least one post being generally aligned with said at least one dynamic support assembly;

controllable means in said dynamic support assembly for urging said workpiece toward said surface for contacting said surface with said at least one post;

said dynamic support assembly including a stable post affixed at a first end to a base;

stable means at a second end of said stable post;

engagement means at said second end;

cooperating means on said workpiece facing said engagement means;

first means for raising said stable post a distance effective for raising said at least one post into stabilizing mechanical engagement with said surface;

a transversely resilient member in said at least one dynamic support assembly;

second means for raising an end of said transversely resilient member into urging contact with said workpiece after said stabilizing mechanical engagement is attained; and said first means for urging also being effective for independently lowering said stable post after said transversely resilient member attain said urging contact, whereby said workpiece is maintained in a raised position supported by said at least one transversely resilient member with said at least one post providing stabilizing mechanical contact with said surface.

3. Apparatus according to claim 2 wherein said stable post includes a piezoelectric device effective for performing said raising.

4. Apparatus according to claim 2 wherein said second means for raising includes a piezoelectric device.

5. Apparatus according to claim 2 wherein said transversely resilient member includes a spring rod.

6. Apparatus according to claim 5 wherein said spring rod includes at least one groove in a surface thereof, said at least one groove being effective for changing a transverse resilience of said spring rod.

7. Apparatus according to claim 5 wherein said spring rod includes means for changing a transverse resilience thereof.

8. Apparatus according to claim 1 wherein said processing apparatus is a beam-forming device.

9. Apparatus according to claim 1 including a positioning table, said at least one dynamic support assembly being disposed on said positioning table.

10. A method for stabilizing a workpiece with respect to a processing apparatus, comprising:

supporting said workpiece with respect to a surface of said processing apparatus;

positioning at least one post on a surface of said workpiece facing said surface;

urging a stable supporting device toward said workpiece, whereby said at least one post is urged toward said surface for contacting said surface with said at least one post;

then urging a transversely resilient member into contact with said workpiece for maintaining contact between said post and said surface; and then lowering said stable supporting device out of contact with said workpiece, whereby said workpiece is retained in an elevated position with said at least one post in stabilizing contact with said generally planar surface by said at least one transversely resilient member, and motion of said processing apparatus is transmitted to said workpiece and motion at an end of said at least one post distal from said workpiece is permitted without imparting said motion at said distal end to said workpiece.

* * * * *